United States Patent
Maggi et al.

(10) Patent No.: US 10,239,748 B2
(45) Date of Patent: Mar. 26, 2019

(54) MICROELECTROMECHANICAL DEVICE WITH PROTECTION FOR BONDING

(71) Applicant: STMicroelectronics S.r.l., Agrate Brianza (IT)

(72) Inventors: Luca Maggi, Garlate (IT); Sebastiano Conti, Mistretta (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 451 days.

(21) Appl. No.: 14/511,002

(22) Filed: Oct. 9, 2014

(65) Prior Publication Data
US 2015/0102434 A1    Apr. 16, 2015

(30) Foreign Application Priority Data

Oct. 16, 2013   (IT) ............................... TO2013A0838

(51) Int. Cl.
| | |
|---|---|
| *H01L 41/313* | (2013.01) |
| *B81B 7/00* | (2006.01) |
| *B81C 1/00* | (2006.01) |
| *H01L 23/00* | (2006.01) |
| *B81C 3/00* | (2006.01) |
| *H04R 19/00* | (2006.01) |

(52) U.S. Cl.
CPC ........ *B81B 7/0048* (2013.01); *B81C 1/00238* (2013.01); *B81C 1/00269* (2013.01); *B81C 1/00825* (2013.01); *B81C 3/001* (2013.01); *H01L 24/26* (2013.01); *B81B 2201/02* (2013.01); *B81B 2201/0257* (2013.01); *B81B 2201/0264* (2013.01); *B81B 2207/012* (2013.01); *B81C 2203/032* (2013.01); *H04R 19/005* (2013.01)

(58) Field of Classification Search
CPC ................... H01L 24/26; B81B 7/0048; B81B 2201/0257; B81B 2201/0264; B81C 1/00238; B81C 1/00269; B81C 3/001
See application file for complete search history.

(56) References Cited

U.S. PATENT DOCUMENTS

| | | | |
|---|---|---|---|
| 3,872,332 A * | 3/1975 | Butter | G10K 11/02 310/334 |
| 2003/0129379 A1* | 7/2003 | Yao | B29C 41/12 428/308.4 |
| 2005/0254673 A1 | 11/2005 | Hsieh et al. | |
| 2009/0236757 A1* | 9/2009 | Mengel | H01L 23/49513 257/783 |
| 2010/0270673 A1 | 10/2010 | Oppermann | |

(Continued)

FOREIGN PATENT DOCUMENTS

| | | |
|---|---|---|
| CN | 1960580 B | 6/2011 |
| CN | 101272636 B | 7/2012 |

(Continued)

*Primary Examiner* — Yu Chen
*Assistant Examiner* — Christopher M Roland
(74) *Attorney, Agent, or Firm* — Seed IP Law Group LLP (57) ABSTRACT

A microelectromechanical device includes: a substrate; a semiconductor die, bonded to the substrate and incorporating a microstructure; an adhesive film layer between the die and the substrate; and a protective layer between the die and the adhesive film layer. The protective layer has apertures, and the adhesive film layer adheres to the die through the apertures of the protective layer.

16 Claims, 5 Drawing Sheets

(56) References Cited

U.S. PATENT DOCUMENTS

| | | | |
|---|---|---|---|
| 2010/0284553 A1* | 11/2010 | Conti | B81B 7/0061 |
| | | | 381/174 |
| 2011/0154905 A1* | 6/2011 | Hsu | G01L 9/0073 |
| | | | 73/724 |
| 2011/0189577 A1* | 8/2011 | Chung | H01M 10/0418 |
| | | | 429/457 |
| 2012/0045078 A1* | 2/2012 | Lander | B81B 7/0048 |
| | | | 381/174 |
| 2012/0074592 A1* | 3/2012 | Luan | H01L 25/16 |
| | | | 257/777 |
| 2013/0001803 A1 | 1/2013 | Mangel et al. | |

FOREIGN PATENT DOCUMENTS

| | | | |
|---|---|---|---|
| CN | 103281660 B | | 11/2015 |
| CN | 103179493 B | | 2/2016 |
| DE | 40 06 108 A1 | | 8/1991 |
| DE | 10303263 A1 | | 8/2004 |
| DE | 102010062555 A1 | | 6/2012 |
| EP | 2 252 077 A1 | | 11/2010 |
| JP | 04085842 A | * | 3/1992 |
| JP | 2000315855 A | * | 11/2000 |
| JP | 20126092 A | | 1/2012 |

* cited by examiner

MICROELECTROMECHANICAL DEVICE WITH PROTECTION FOR BONDING

BACKGROUND

Technical Field

The present disclosure relates to a microelectromechanical device with protection for bonding and to a process for manufacturing a microelectromechanical device.

Description of the Related Art

As is known, in recent years there have been developed microelectromechanical systems (also referred to as MEMS devices) for a wide range of applications, both in the field of sensors (accelerometers, gyroscopes, pressure sensors) and in the field of mechanical and fluidic actuation (micromotors, micropumps). Devices of this type are widely used, for example, in portable electronic apparatuses, such as portable computers, laptops or ultrabooks, PDAs, tablets, cellphones, smartphones, digital audio players, photographic cameras or video cameras, and consoles for videogames, enabling considerable advantages to be achieved as regards the occupation of space, in terms of area and thickness, and consumption levels.

In most cases, a MEMS device comprises a microstructure with movable and/or deformable parts, and a control device. The control device, according to the cases, may read the mechanical configuration of the microstructure, through measurement of electrical quantities associated thereto (for example, capacitance of capacitors with movable or deformable electrodes), or else apply electrical signals for causing controlled movements or deformations of the microstructure (for example, electrostatic forces between the movable electrodes of a capacitor).

Given that the respective machining processes differ remarkably, the microstructure and the control device are in general made in distinct semiconductor dice and then encapsulated in a common package, with the required electrical connections.

The assembly of the microstructure die and of the control device die requires using adhesive materials and may comprise steps at a wafer level or at a die level. In the former case, a wafer containing the microstructure is bonded to a supporting substrate and divided into dice only subsequently, so that each microstructure is already coupled to a respective substrate portion. In the latter case, the wafer is divided into dice, which are individually picked up and placed on a respective support ("pick and place" operation).

The assembly may present critical aspects, especially in the case of the microstructure.

The adhesive material used is frequently in the form of a film that is laminated directly on the wafer containing the microstructure prior to dicing. This solution is usually preferred to laying glues, because it produces one of the best process yields. On the one hand, in fact, the film adhesives do not require steps of hot curing, and hence the production time is shorter. On the other hand, the glues laid, until curing is completed, do not guarantee that proper positioning is maintained, thus producing a higher percentage of rejects.

Even when film adhesives are used, however, some problems may arise, in particular when the microstructure dice have wide cavities or deep trenches on the side to be bonded to the support, as in the case of microphones and pressure sensors. During lamination, which requires application of pressure, or during the pick-and-place operations (when a vacuum is, instead, created), the adhesive may penetrate into the cavity until it comes into contact with the microstructure, limiting the freedom of movement thereof. Even in less critical cases, where there is no direct contact with the movable parts of the microstructure, the presence of adhesive in the cavity may alter operation of the device. In microphones, for example, the cavity serves as resonance chamber, and its characteristics define the response of the device. Clearly, if the free space in the cavity is in part occupied by foreign material, such as the adhesive, the properties of the device are modified in an unpredictable way as compared to the design conditions.

BRIEF SUMMARY

One or more of the present disclosure is directed to a microelectromechanical device and a process for manufacturing a microelectromechanical device. Some embodiments may overcome or at least attenuate the limitations described.

According to one embodiment of the present disclosure, a microelectromechanical device includes a substrate and a semiconductor die incorporating a microstructure. The die is adhered to the substrate. A film adhesive layer is located between the die and the substrate. A protective layer having apertures is located between the die and the film adhesive layer. The film adhesive layer adheres the die to the substrate through the apertures of the protective layer.

BRIEF DESCRIPTION OF THE SEVERAL VIEWS OF THE DRAWINGS

For a better understanding of the disclosure, some embodiments thereof will now be described, purely by way of non-limiting example and with reference to the attached drawings, wherein.

DETAILED DESCRIPTION

Two embodiments of the disclosure will be described hereinafter with particular reference to electroacoustic transducers and to pressure sensors. This should not be considered limiting, however. The embodiments of the disclosure may advantageously be utilized for any type of microelectromechanical device that comprises a die incorporating a microstructure with movable parts bonded to a supporting substrate, which may be another semiconductor die, possibly integrating control circuits or else a different substrate, such as a portion of a package for integrated devices. Furthermore, the embodiments are particularly suited to being utilized in microelectromechanical devices in which the die defines a cavity in which the microstructure is housed.

Figure 1:
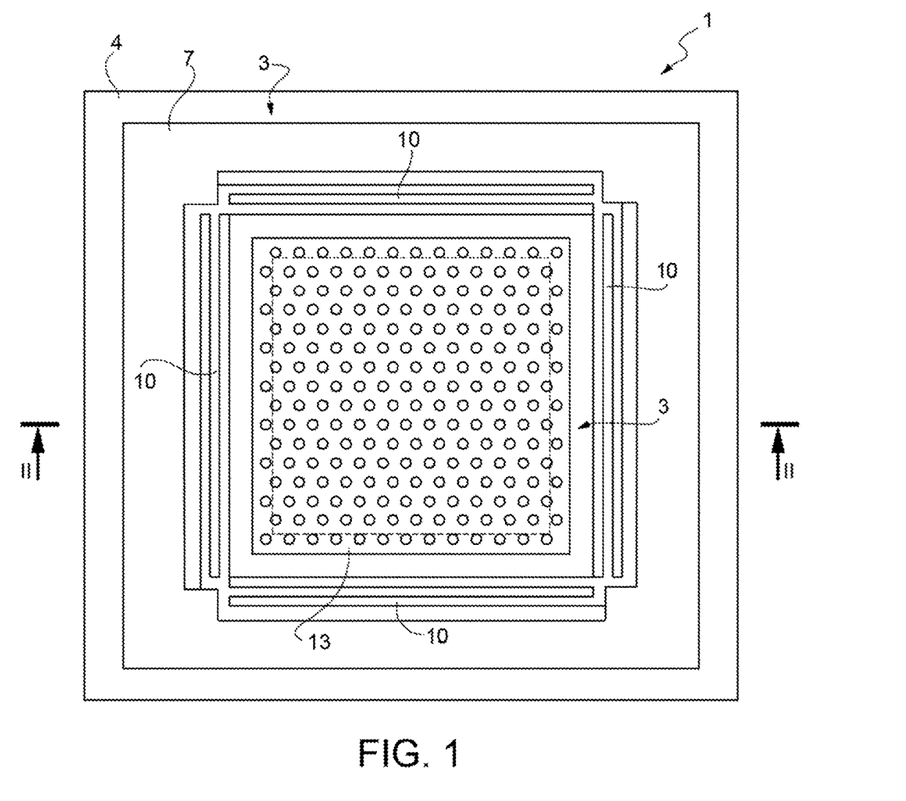
FIG. 1 is a top plan view of a microelectromechanical device according to one embodiment of the present disclosure.
Figure 2:
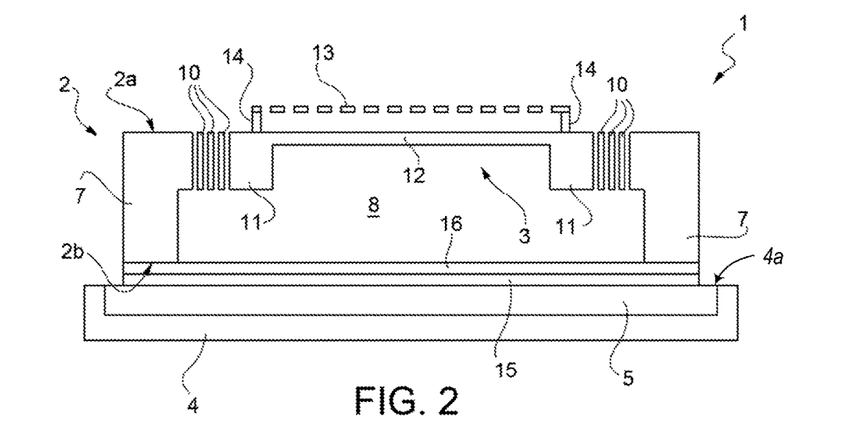
FIG. 2 is a cross section through the microelectromechanical device of FIG. 1, taken along the line II-II of FIG. 1.

FIGS. 1 and 2 illustrate an electroacoustic transducer provided with MEMS technology, designated as a whole by the reference number 1.

The transducer 1 comprises a first die 2, containing a microstructure 3, and a second die 4, in which an integrated control circuit or ASIC (application-specific integrated circuit) 5 has been formed. The first die 2 and the second die 4 are bonded together, as explained in greater detail hereinafter, and the second die 4 also functions as a supporting substrate for the first die 2.

The first die 2 has faces 2a, 2b opposite to one another and comprises a supporting frame 7 to which the microstructure 3 is connected. The supporting frame 7 and the microstructure 3 are both made of semiconductor material, for example monocrystalline silicon.

The supporting frame 7 is bonded to the second die 4 on the side of the face 2b and defines inside it a cavity 8, over which the microstructure 3 is suspended.

The microstructure 3 is formed on the side of the face 2a of the first die 2 and is elastically coupled to the supporting frame 7 by elastic connection elements 10. The connection elements 10 are, for example, defined by folded plates of semiconductor material and are configured to enable relative movements of the microstructure 3 with respect to the supporting frame 7 parallel to the face 2a of the first die 2. In practice, connection by the connection elements 10 enables the microstructure 3 to be kept suspended over the cavity 8 at a distance from the second die 4 and makes it possible to eliminate or reduce considerably the effects of thermal and mechanical stresses that might otherwise cause deformation or failure.

The microstructure 3 comprises a movable frame 11, for example having a quadrangular shape, and a deformable semiconductor membrane 12, which is supported along its own perimeter by the movable frame 11. The movable frame 11 is connected to the supporting frame 7 by the connection elements 10 and is open, so that the membrane 12 faces the cavity 8. Furthermore, the membrane 12 is parallel to the face 2a of the first die 2.

In one embodiment, the connection elements 10 and the movable frame 11 have a thickness equal to or smaller than the thickness of the supporting frame 7. In this way, the connection elements 10 and the movable frame 11 occupy just a portion of the cavity 8, on the side of the face 2a of the first die 2.

A conductive and perforated rigid plate 13 faces the membrane 12 on the side opposite to the cavity 8. The membrane 12 and the rigid plate 13 are electrically insulated by a dielectric spacer structure 14 and define respective electrodes of a detection capacitor with variable capacitance. In particular, the capacitance of the detection capacitor is determined by the configuration of the membrane 12, which may vary in response to acoustic signals in the form of pressure waves.

The face 2b of the first die 2 is bonded to a face 4a of the second die 4 via interposition of an adhesive film layer 15 and of a protective layer 16. The adhesive film layer 15 is in contact with the face 4a of the second die 4, and the protective layer 16 is set between the adhesive film layer 15 and the supporting frame 7 of the first die 2. The protective layer 16 moreover extends over the entire area corresponding to the cavity 8, thus delimiting the cavity 8 itself and separating it from the adhesive film layer 15.

The protective layer 16 is made of a material that has micro-apertures or micropores and enables the adhesive film layer 15, which is viscous, to penetrate when pressure is applied, without, however, escaping therefrom. In practice, the protective layer 16 is selected so that it may be penetrated, under pressure, by the material that forms the adhesive film layer 15, which is, however, retained as a result of capillary action and does not escape from the micro-apertures (or micropores) of the protective layer 16. In this way, the first die 2 may be bonded to the second die 4 without the use of additional adhesive materials and, moreover, the protective layer 16 prevents the material forming the adhesive film layer 15 from penetrating into the cavity 8, as will be also discussed in greater detail hereinafter. The adhesive film layer 15 may be double-sided tape.

Furthermore, the protective layer 16 is made of a resilient material so that it may undergo deformation, when pressure is applied, and then return into a resting configuration when pressure ceases to be applied.

Figure 3:
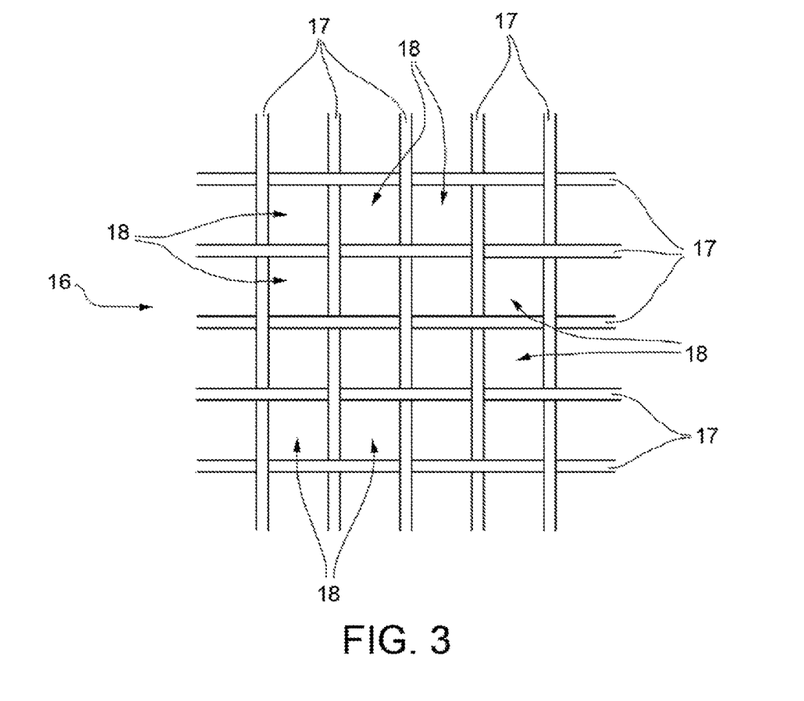
FIG. 3 is an enlarged top plan view of a detail of the microelectromechanical device of FIG. 1.

In one embodiment, to which FIG. 3 refers by way of example, the protective layer 16 is a layer of a woven material of polymeric fibers 17 forming meshes 18. The polymeric fibers 17 may, for example, be single strands of polyethylene terephthalate (PET) or polyether ether ketone (PEEK). The dimensions of the meshes 18 are selected according to the viscosity of the material forming the adhesive film layer 15 so that the latter may penetrate without escaping. For instance, the meshes 18 may be quadrangular with a side between 7 µm and 35 µm, preferably between 10 µm and 27 µm.

Woven materials are particularly suited both because the dimensions of the micro-apertures, defined by the meshes 18, may be chosen in a simple way and with a wide margin of freedom and because of their resilience. Alternatively, the protective layer 16 may be made of sheets of porous polymeric material, for example PET.

Figure 4:
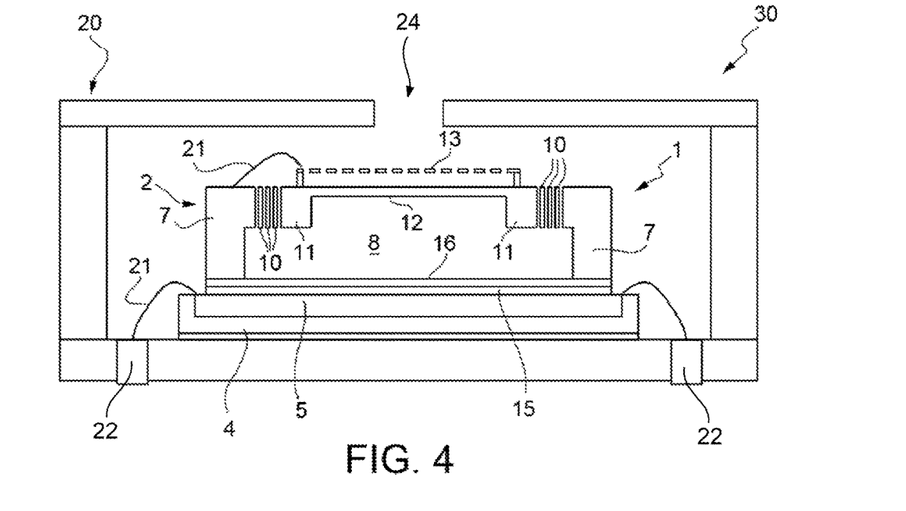
FIG. 4 is a cross section through a microelectromechanical microphone incorporating the microelectromechanical device of FIG. 1.

The electroacoustic transducer 1 may be encapsulated in a package 20 for integrated devices to make a microphone 30, as shown in FIG. 4. Here, purely by way of example, also electrical connections 21 are indicated between the first die 2, the second die 4, and the contacts 22 of the package 20, as well as an aperture that defines an acoustic inlet 24 in the package 20 for the electroacoustic transducer 1.

Figure 5:
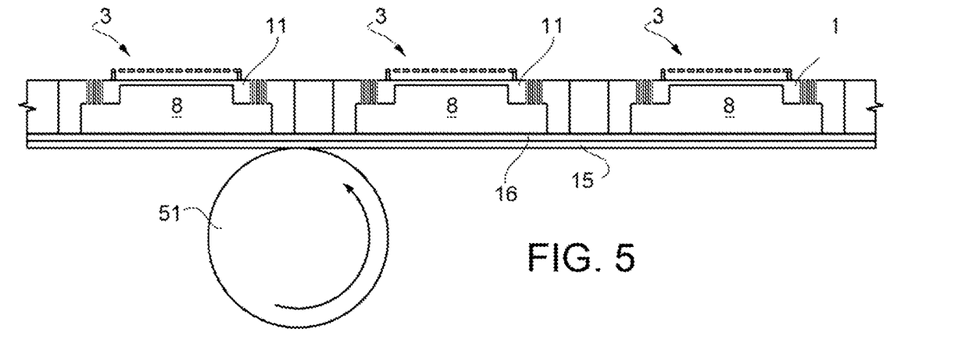
FIG. 5 is a cross section through a wafer of semiconductor material incorporating a plurality of examples of microstructure, in a step of a process for manufacturing the microelectromechanical device of FIG. 1.

The electroacoustic transducer 1 is made as described in what follows. By steps of micromachining, a plurality of microstructures 3 arranged in an array are formed in a semiconductor wafer 50, as shown in FIG. 5.

Figure 6:
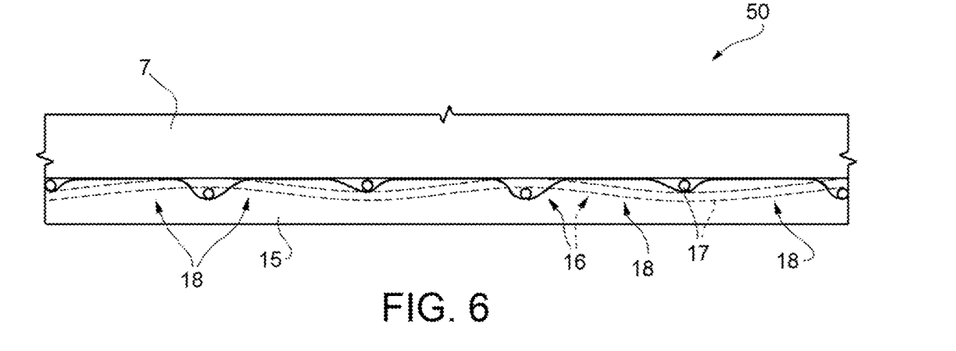
FIG. 6 shows a first enlarged detail of the wafer of FIG. 5.
Figure 7:
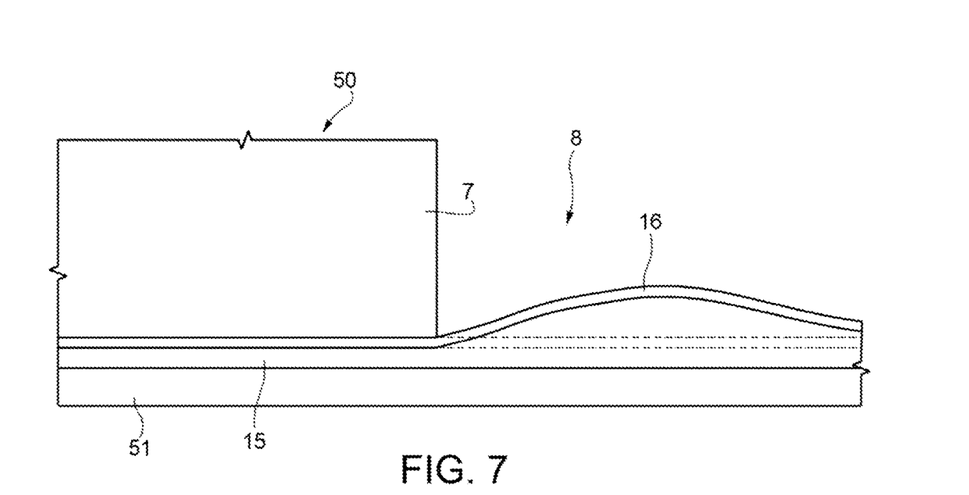
FIG. 7 shows a second enlarged detail of the wafer of FIG. 5.

The protective layer 16 and the adhesive film layer 15 are laminated on the face of the wafer 50 where the cavities 8 are located (hence opposite with respect to the movable frame 11 of the microstructure 3). During lamination, a pressure member 51, for example a roller, is used for exerting a pressure on the adhesive film layer 15 and on the protective layer 16 against the wafer 50. In this step, the adhesive film layer 15 penetrates through the micro-apertures, i.e., the meshes 18, of the protective layer 16 and adheres to the wafer 50, also holding the protective layer 16 (FIG. 6). The adhesive film layer 15 tends to penetrate into the cavities 8, deforming the protective layer 16 (FIG. 7). However, the protective layer 16 retains the adhesive film layer 15, which cannot escape towards the cavities 8 and, due to its resilience, tends to return into the undeformed configuration (indicated by a dashed line in FIG. 7) once the action of the pressure member 51 has terminated.

The wafer 50 is separated into a plurality of individual first dice 2, each of which comprises a microstructure 3 and respective portions of the protective layer 16 and of the adhesive film layer 15.

Separately, another semiconductor wafer (not illustrated herein) is machined to provide integrated control circuits 5 and separated into a plurality of individual second dice 4.

The first dice 2 are bonded to respective second dice 4 by a pick-and-place process, thus obtaining electroacoustic transducers 1 of the type illustrated in FIGS. 1 and 2. The electroacoustic transducers 1 are equipped with the electrical connections 21, which enable electrical coupling between the microstructure 3 and the integrated control circuit 5, and encapsulated in respective packages 20 to obtain the microphones 30 of FIG. 3.

Alternatively, the semiconductor wafers containing the microstructures 3 provided with protective layer 16 and adhesive film layer 15, and the wafers containing the integrated control circuits 5 are bonded prior to dicing, thus avoiding the use of the pick-and-place procedure during assembly.

In either case, the protective layer 16 advantageously facilitates the use of film adhesives, preventing at the same time the cavities of the microstructure from being possibly occupied by foreign material. The solution described thus enables preservation both of the mobility of the microstructures and of the characteristics of acoustic response of the transducers.

Figure 8:
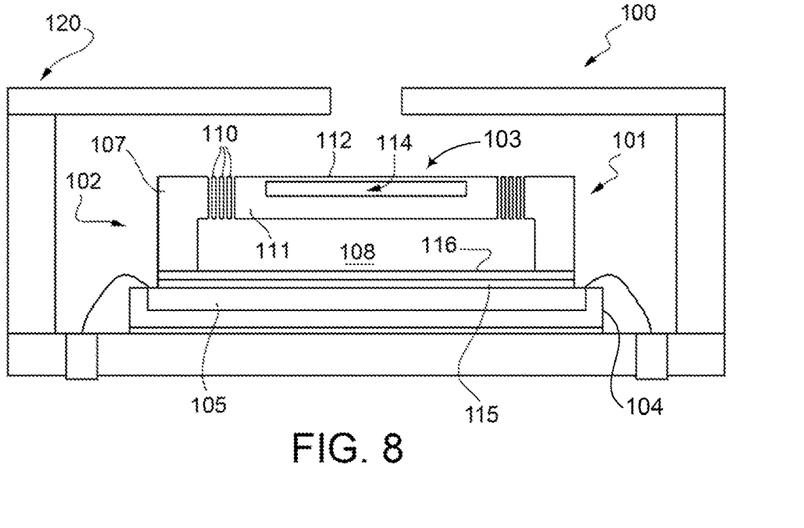
FIG. 8 is a cross section of a microelectromechanical pressure sensor incorporating a microelectromechanical device according to a different embodiment of the present disclosure.

According to the embodiment illustrated in FIG. 8, a pressure sensor 100 comprises a pressure transducer 101 encapsulated in a package 120. The pressure transducer 101 comprises a first die 102, containing a microstructure 103, and a second die 104, in which an integrated control circuit or ASIC 105 has been formed. The first die 102 and the second die 104 are bonded together, and the second die 104 functions also as supporting substrate for the first die 102.

The first die 102 comprises a supporting frame 107, defining a cavity 108 inside it, and a microstructure 103, which occupies a portion of the cavity 108 and is elastically coupled to the supporting frame 107 by connection elements 110.

The microstructure 103 comprises a movable body 111, provided in which is a reference chamber 114, defined by a closed cavity and delimited on one side by a membrane 112. The membrane 112 is deformable as a result of the difference in pressure between the reference chamber 114 and the external environment. In one embodiment, the membrane 112 is conductive, is insulated from the movable body 111, and defines a first electrode of a variable-capacitance capacitor. A second, fixed, electrode may be provided on the bottom of the reference chamber 114. Alternatively, the membrane 112 may comprise piezoelectric regions, which undergo mechanical stresses following upon deformations of the membrane 112. The piezoelectric regions are hence able to supply electrical signals representative of the configuration of the membrane 112.

The first die 102 and the second die 104 are bonded together using an adhesive film layer 115, with the cavities 108 of the first die 102 facing the second die 104. Moreover a protective layer 116 is set between the first die 102 and the adhesive film layer and delimits the cavities 108, preventing entry of the material forming the adhesive film layer 115.

The protective layer 116 is made of resilient material and has micro-apertures that enable the material forming the adhesive film layer 115 to penetrate through the protective layer 116 itself until it adheres to a face of the first die 102 when pressure is applied, without, however, escaping on the opposite side.

Figure 9:
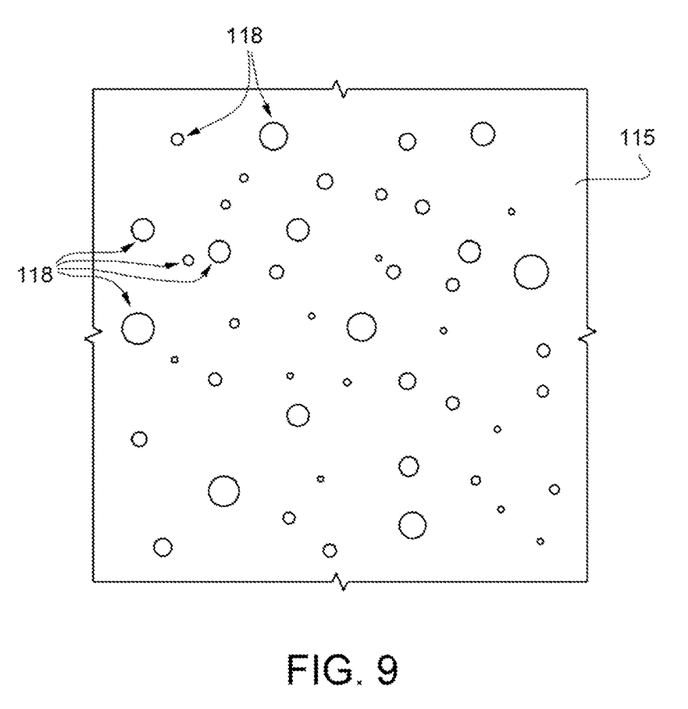
FIG. 9 is an enlarged top plan view of a detail of the microelectromechanical device of FIG. 8.

In one embodiment, the protective layer 116 (FIG. 9) is a layer of porous polymeric material, with pores 118 having a diameter between 5 µm and 35 µm, preferably between 7 µm and 27 µm.

Figure 10:
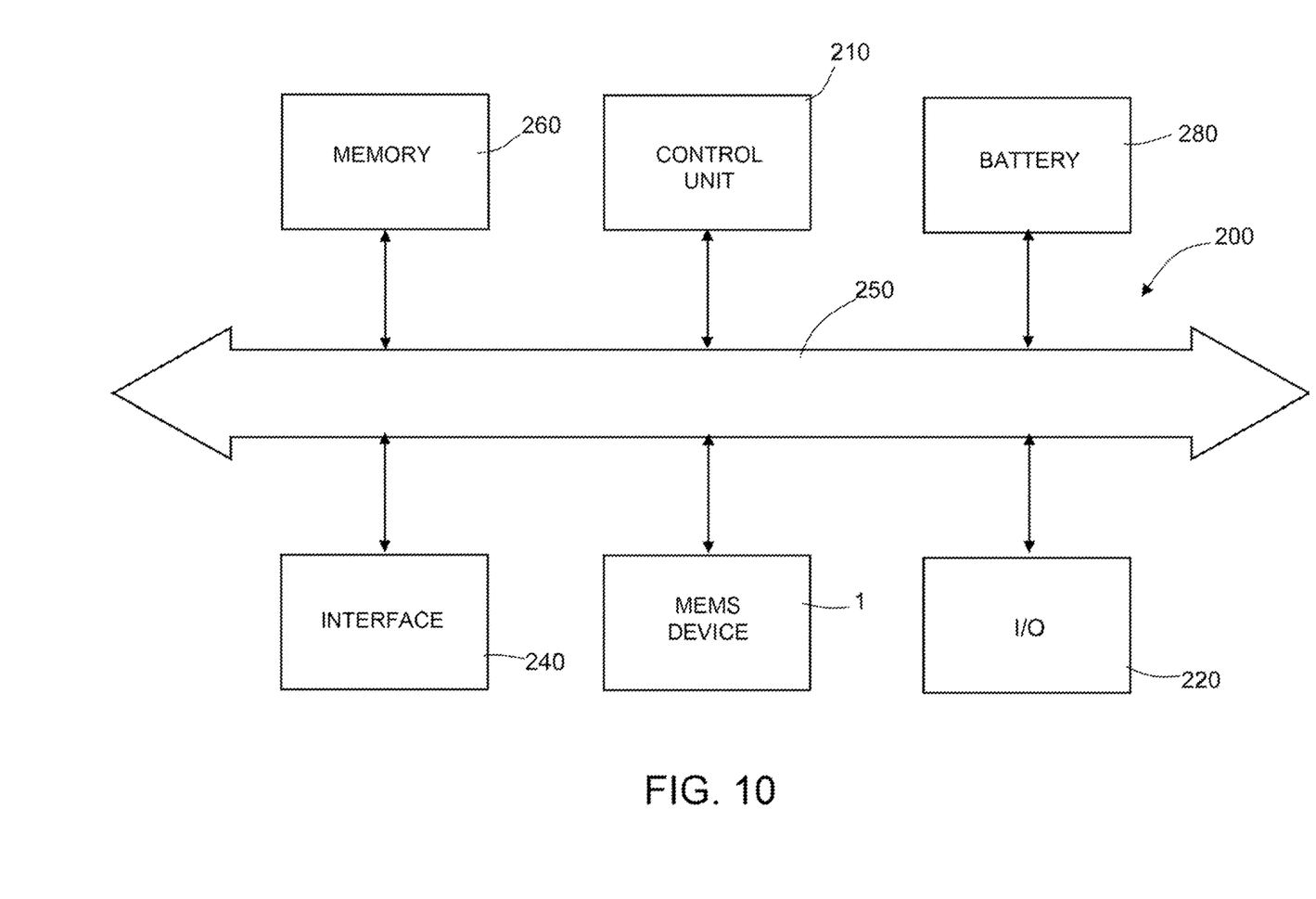
FIG. 10 is a simplified block diagram of an electronic system incorporating a microelectromechanical device according to one embodiment of the present disclosure.

Illustrated in FIG. 10 is a portion of an electronic system 200 according to one embodiment of the present disclosure. The system 200 incorporates the electromechanical transducer 1 and may be used in devices such as, for example, a laptop or tablet, possibly with wireless-connection capacity, a cellphone, a smartphone, a messaging device, a digital musical player, a digital camera, or other devices designed to process, store, transmit, or receive information. In particular, the electroacoustic transducer 1 may be used for providing functions of voice control, for example, in a motion-activated user interface for computers or consoles for videogames or in a satellite navigation device.

The electronic system 200 may comprise a control unit 210, an input/output (I/O) device 220 (for example, a keyboard or a display), the electroacoustic transducer 1, a wireless interface 240, and a memory 260, of a volatile or nonvolatile type, coupled to one another through a bus 250. In one embodiment, a battery 280 may be used for supplying power to the system 200. It is to be noted that the scope of the present disclosure is not limited to embodiments necessarily having one or all of the devices listed.

The control unit 210 may comprise, for example, one or more microprocessors, microcontrollers, and the like.

The I/O device 220 may be used for generating a message. The system 200 may use the wireless interface 240 for transmitting and receiving messages to and from a wireless communication network with a radiofrequency (RF) signal. Examples of wireless interface may comprise an antenna, a wireless transceiver, such as a dipole antenna, even though the scope of the present disclosure is not limited from this standpoint. Furthermore, the I/O device 220 may supply a voltage representing what is stored either in the form of digital output (if digital information has been stored) or in the form of analog output (if analog information has been stored).

Finally, it is evident that modifications and variations may be made to the microelectromechanical device and to the process described, without thereby departing from the scope of the present disclosure.

In the first place, it is possible to provide microelectromechanical devices other than electroacoustic transducers and pressure sensors, such as accelerometers and gyroscopes.

The dice containing the microstructure and the integrated control circuit may not be stacked, but bonded to a common support, either directly or with the interposition of further supporting and/or functional layers. For instance, the dice may be bonded to a substrate forming part of the package.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A microelectromechanical device comprising:
a substrate;
a semiconductor die adhered to the substrate and incorporating a microstructure, the die including a supporting frame defining a cavity;
a film adhesive layer between the supporting frame and the substrate; and
a layer of porous material between the supporting frame and the film adhesive layer, the layer of porous material having a plurality of pores, the film adhesive layer adhering the die to the substrate through the plurality of pores of the layer of porous material, the cavity overlapping a portion of the film adhesive layer and a portion of the layer of porous material.

2. The device according to claim 1, wherein each of the plurality of pores has a diameter between 35 µm and 5 µm.

3. The device according to claim 1, wherein the layer of porous material is made of a polymeric material.

4. The device according to claim 1, wherein the microstructure overlies the cavity and is a distance from the substrate.

5. The device according to claim 4, wherein the film adhesive layer adheres to the supporting frame.

6. The device according to claim 4, wherein the microstructure is elastically coupled to the supporting frame through elastic connection elements and suspended above the cavity.

7. The device according to claim 6, wherein the connection elements are configured to allow relative movements of the microstructure with respect to the supporting frame.

8. The device according to claim 4, wherein the microstructure includes a movable supporting element elastically coupled to the supporting frame, and a semiconductor membrane supported by the movable supporting element.

9. The microelectromechanical device according to claim 1, wherein the substrate comprises an integrated control circuit electrically coupled to the microstructure.

10. The microelectromechanical device of claim 1, wherein the supporting frame includes an elevated portion and sidewalls.

11. The microelectromechanical device of claim 10, wherein the film adhesive layer and the layer of porous material extend from a first sidewall of the sidewalls, across the cavity, and to a second sidewall, opposite to the first sidewall, of the sidewalls.

12. The microelectromechanical device of claim 1, further comprising an integrated circuit in the substrate, the integrated circuit being spaced from the die by the film adhesive layer and the layer of porous material.

13. A microelectromechanical microphone comprising:
a microelectromechanical device including:
a first semiconductor die;
a second semiconductor die having a first surface and a second surface opposite to the first surface, the first surface including a movable membrane, the second surface including a cavity, the second surface facing the first semiconductor die;
a film adhesive layer between the second semiconductor die and the first semiconductor die, the film adhesive layer in physical contact with the first semiconductor die; and
a protective layer between the second semiconductor die and the film adhesive layer, the protective layer including a plurality of apertures, the film adhesive layer extending through the apertures of the protective layer and physically contacting the second surface of the second semiconductor die to adhere the second semiconductor die to the first semiconductor die, the cavity directly overlying a portion of the film adhesive layer and a portion of the protective layer.

14. The microelectromechanical microphone according to claim 13, wherein the protective layer includes at least one of a resilient material, a layer of woven material, and sheets of porous polymeric material.

15. An electronic system comprising:
a control unit; and
a microelectromechanical device coupled to the control unit, the microelectromechanical device including:
a first semiconductor die having a surface;
a second semiconductor die including a support frame and a microstructure, the support frame forming a cavity, the microstructure overlying the cavity;
a film adhesive layer adhering to the surface of the first semiconductor die; and
a protective layer having a plurality of pores located between the support frame and the film adhesive layer,
the film adhesive layer extending from a first side of the protective layer, through the plurality of pores of the protective layer, and to a second side, opposite to the first side, of the protective layer,
the film adhesive adhering the support frame of the second semiconductor die to the first semiconductor die,
the film adhesive layer and the protective layer extending across the cavity such that the microstructure overlies the film adhesive layer and the protective layer.

16. The electronic system according to claim 15, wherein the protective layer includes sheets of porous polymeric material.

* * * * *